US009872416B2

(12) United States Patent
Ke et al.

(10) Patent No.: US 9,872,416 B2
(45) Date of Patent: Jan. 16, 2018

(54) COMMUNICATIONS PRODUCT AND BASE STATION SYSTEM (71) Applicant: HUAWEI TECHNOLOGIES CO., LTD., Shenzhen, Guangdong (CN)

(72) Inventors: Youhe Ke, Shenzhen (CN); Yuping Hong, Shenzhen (CN); Mingliang Hao, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/435,711

(22) Filed: Feb. 17, 2017

(65) Prior Publication Data
US 2017/0164514 A1 Jun. 8, 2017

Related U.S. Application Data (63) Continuation of application No. PCT/CN2015/070106, filed on Jan. 5, 2015.

(30) Foreign Application Priority Data

Aug. 21, 2014 (CN) .......................... 2014 1 0416227

(51) Int. Cl.
H05K 7/20 (2006.01)
H04W 88/08 (2009.01)
(Continued)

(52) U.S. Cl.
CPC ... *H05K 7/20145* (2013.01); *H04B 10/25752* (2013.01); *H04Q 1/035* (2013.01); *H04W 88/085* (2013.01)

(58) Field of Classification Search
CPC ................ H04Q 1/035; H04W 88/085; H04B 10/25752; H04B 10/1143;
(Continued)

(56) References Cited

U.S. PATENT DOCUMENTS

2002/0069660 A1 6/2002 Livni
2012/0222444 A1 9/2012 Li et al.
(Continued)

FOREIGN PATENT DOCUMENTS

CN 101217858 A 7/2008
CN 101645714 A 2/2010
(Continued)

OTHER PUBLICATIONS

Extended European Search Report dated Aug. 9, 2017 in corresponding European Patent Application No. 15834567.8.
(Continued)

*Primary Examiner* — Ted Wang
(74) *Attorney, Agent, or Firm* — Staas & Halsey LLP (57) ABSTRACT The present invention discloses a communications product (100), including a remote radio module (10) and a mounting kit (30), where the mounting kit (30) includes a fastening part (32), the fastening part (32) is configured to mount and fasten the remote radio module (10) to a holder, the mounting kit (30) further includes a ventilation part (34) and an air supply part (36), an air source is disposed inside the air supply part (36), the ventilation part (34) is connected between the fastening part (32) and the air supply part (36), a ventilation channel is disposed inside the ventilation part (34), and the ventilation channel allows the air supply part (36) to communicate with the remote radio module (10), so that an air flow generated by the air source reaches the remote radio module (10) after passing through the ventilation channel, to dissipate heat for the remote radio module.

23 Claims, 5 Drawing Sheets (51) Int. Cl.
*H04Q 1/02* (2006.01)
*H04B 10/2575* (2013.01)

(58) Field of Classification Search
CPC ........ H04B 10/25758; H04B 10/25753; H05K 7/20145; H04J 14/0298
See application file for complete search history.

(56) References Cited

U.S. PATENT DOCUMENTS

| | | | |
|---|---|---|---|
| 2014/0301734 A1* | 10/2014 | Fang | H04J 14/005 398/76 |
| 2015/0382504 A1 | 12/2015 | Hu et al. | |
| 2016/0057888 A1 | 2/2016 | Hong et al. | |
| 2017/0164215 A1* | 6/2017 | Chen | H04W 24/02 |

FOREIGN PATENT DOCUMENTS

| | | |
|---|---|---|
| CN | 101754644 A | 6/2010 |
| CN | 201718149 U | 1/2011 |
| CN | 202104000 U | 1/2012 |
| CN | 104780743 A | 7/2015 |
| CN | 105357777 A | 2/2016 |
| EP | 2698922 A1 | 2/2014 |
| WO | 02/49400 A2 | 6/2002 |
| WO | 2004/105261 A1 | 12/2004 |
| WO | 2011/002116 A1 | 1/2011 |
| WO | 2013/123778 A1 | 8/2013 |
| WO | 2013/135093 A1 | 9/2013 |

OTHER PUBLICATIONS

International Search Report dated May 15, 2015 in corresponding International Application No. PCT/CN2015/070106.
International Search Report dated May 15, 2015 in corresponding International Patent Application No. PCT/CN2015/070106.
Chinese Search Report dated Apr. 26, 2017 in corresponding Chinese Patent Application No. 2014104162274.
Chinese Office Action dated May 2, 2017 in corresponding Chinese Patent Application No. 201410416227.4.

* cited by examiner

COMMUNICATIONS PRODUCT AND BASE STATION SYSTEM

CROSS-REFERENCE TO RELATED APPLICATIONS

This application is a continuation of International Application No. PCT/CN2015/070106, filed on Jan. 5, 2015, which claims priority to Chinese Patent Application No. 201410416227.4, filed on Aug. 21, 2014, All of the aforementioned patent applications are hereby incorporated by reference in their entireties.

TECHNICAL FIELD

The present invention relates to a communications product of a base station system, and in particular, to a heat dissipation architecture of a communications product.

BACKGROUND

A remote radio module (RRU: Remote Radio Unit) is a distributed network coverage mode, which allows large-capacity macrocell base stations to be placed in an available central equipment room in a centralized manner, baseband parts to be processed in a centralized manner, and radio modules in a base station to be remotely deployed as the remote radio module by using an optical fiber and to be separately placed on sites determined by means of network planning, thereby saving a large quantity of equipment rooms required in a conventional solution.

Due to the foregoing advantages of the RRU, the RRU has been widely applied. When the RRU is mounted closely to an antenna, considering bearing, wind resistance, and construction costs of a mounting iron pole, operators expect that the RRU should be as small as possible in size and weight. Therefore, a requirement for miniaturization of the RRU continues to exist. During an early phase, an RRU in the industry has relatively low output power and low overall heat consumption, performs natural heat dissipation in a case of a specific size, and relies on natural convection to dissipate heat of a radio module. As output power of an RRU module increases, heat consumption of the RRU module gradually increases, and an increasingly high requirement for heat dissipation is imposed.

In the prior art, an RRU is fastened and connected to a mounting kit, and the RRU is fastened to a mounting iron pole close to an antenna by using the mounting kit. The RRU uses an air-cooled heat dissipation manner, which is specifically as follows: a fan box is externally hung on a single RRU device, to dissipate beat for the single RRU device. The fan box provides heat dissipation for a single RRU, where the fan box that is externally hung increases a size of the single RRU, which is not helpful for the development of product miniaturization.

Therefore, how to design a communications product including an RRU and an RRU heat dissipation architecture to ensure heat dissipation of the RRU and also ensure size miniaturization of the RRU is an ongoing research topic in the industry.

SUMMARY

A technical problem to be resolved in the present invention is to provide a communications product including a remote radio module (RRU), so that heat dissipation of an RRU can be ensured and it is also helpful for a size miniaturization design of an RRU product. The present invention provides a heat dissipation architecture with a compact structure.

To achieve the foregoing objective, implementation manners of the present invention provide the following technical solutions:

According to one aspect, the present invention provides a communications product, including a remote radio module and a mounting kit, where the mounting kit includes a fastening part, the fastening part is configured to mount and fasten the remote radio module to a holder, the mounting kit further includes a ventilation part and an air supply part, an air source is disposed inside the air supply part, the ventilation part is connected between the fastening part and the air supply part, a ventilation channel is disposed inside the ventilation part, and the ventilation channel allows the air supply part to communicate with the remote radio module, so that an air flow generated by the air source reaches the remote radio module after passing through the ventilation channel, to dissipate heat for the remote radio module.

In a first possible implementation manner, the air supply part and the fastening part are located on two opposite sides of the ventilation part respectively, the three parts are arranged in a straight line, and the ventilation part is located right below or above the fastening part.

In a second possible implementation manner, the remote radio module includes a front end plate, a rear end plate, a remote radio body, and multiple heat dissipation fins, where the remote radio body is connected between the front end plate and the rear end plate, the multiple heat dissipation fins are located between the from end plate and the rear end plate and disposed on the remote radio body in a protruding manner, and the mounting kit is connected to the rear end plate.

With reference to the second possible implementation manner, in a third possible implementation manner, a first air vent is disposed on the rear end plate, a second air vent is disposed on the air supply part, a first opening window and a second opening window are disposed on two adjacent side surfaces of the ventilation part respectively, the first opening window is butt-jointed to the first air vent, and the second opening window is butt-jointed to the second air vent.

With reference to the third possible implementation manner, in a fourth possible implementation manner, the multiple heat dissipation fins are distributed on two sides of the remote radio body, and the butt-joint of the first air vent to the first opening window allows the ventilation channel to communicate with the heat dissipation fins on the two sides of the remote radio body.

With reference to the second possible implementation manner, in a fifth possible implementation manner, there are multiple remote radio modules, the multiple remote radio modules overlap each other to form two rows of communications components, the mounting kit is located between the two rows of communications components, and the rear end plate of the remote radio module in one row of communications components faces the rear end plate of the remote radio module in the other row of communications components.

With reference to the fifth possible implementation manner, in a sixth possible implementation manner, there are multiple mounting kits, and the mounting kits are arranged in a single-row structure.

With reference to the sixth possible implementation manner, in a seventh possible implementation manner, a first air vent is disposed on the rear end plate of each remote radio module, a second air vent is disposed on each air supply part, one pair of first opening windows and one second opening window are disposed on each ventilation part, the pair of first opening windows is distributed on two sides of the ventilation channel, the pair of first opening windows is respectively butt-jointed to the first air vents of the remote radio modules, which are located on two sides of the mounting kit, the second opening window is distributed at the bottom or the top of the ventilation channel, and the second opening window is butt-jointed to the second air vent.

With reference to one of the second to seventh possible implementation manners, in an eighth possible implementation manner, the remote radio module further includes an air deflection structure, where the air deflection structure communicates with the ventilation part internally, the air deflection structure is surrounded by the heat dissipation fins, and the air flow flows from the ventilation part into the air deflection structure and then is transmitted to the heat dissipation fins.

With reference to the eighth possible implementation manner, in a ninth possible implementation manner, the air deflection structure includes an air deflection cover plate and multiple air deflection pillars, the multiple heat dissipation fins and the remote radio body surround together to form an air deflection cavity, the multiple air deflection pillars extend from side surfaces of the remote radio body and are distributed inside the air deflection cavity, the air deflection cover plate covers top ends of the multiple air deflection pillars and blocks the air deflection cavity, and the air flow enters the air deflection cavity and is distributed into the multiple heat dissipation fins after passing through the air deflection pillars.

With reference to the ninth possible implementation manner, in a tenth possible implementation manner, the heat dissipation fins and the remote radio body together form an accommodating cavity, the air deflection structure includes an air deflection cover plate and multiple air deflection plates, multiple air deflection channels are formed inside the accommodating cavity by using the multiple air deflection plates, the air deflection cover plate is fastened to the remote radio body and blocks the accommodating cavity, and the air flow enters the accommodating cavity and is distributed into the heat dissipation fins after passing through the air deflection channels disposed between the multiple air deflection plates.

With reference to one of the eighth to tenth possible implementation manners, in an eleventh possible implementation manner, the air deflection structure is adjacent to the rear end plate.

According to another aspect, the present invention further provides a base station system, including an equipment room and an antenna, where a baseband processing unit is disposed inside the equipment room, the base station system further includes the communications product in any one of the foregoing possible implementation manners, the remote radio module of the communications product is connected to the baseband processing unit by using an optical fiber, the holder is close to the antenna, and the remote radio module is electrically connected to the antenna.

In the present invention, an air supply part provided with an air source is disposed on a mounting kit; in addition, a ventilation part provided with a ventilation channel is disposed on the mounting kit, to allow the air source to communicate with a remote radio module. External space of a fastening part of the mounting kit is used in the communications product in the present invention to dispose the ventilation part and the air supply part, which avoids disposing of a fan box on the remote radio module. The ventilation part and the air supply part are integrated with the fastening part into the mounting kit, to mount the remote radio module on a holder. Therefore, the ventilation part and the air supply part do not occupy space of the remote radio module, which helps to make the remote radio module thin and small. Because a separate air supply part is disposed on the mounting kit in the present invention, and the separate air supply part can provide a stronger air flow, different air sources may be selected according to different requirements for heat dissipation of the remote radio module. Therefore, the present invention is also helpful for heat dissipation of the remote radio module.

BRIEF DESCRIPTION OF DRAWINGS

To describe the technical solutions of the present invention more clearly, the following briefly describes the accompanying drawings required for describing the implementation manners. Apparently, the accompanying drawings in the following description show merely some implementation manners of the present invention, and a person of ordinary skill in the art may still derive other drawings from these accompanying drawings without creative efforts.

DESCRIPTION OF EMBODIMENTS

The following clearly describes the technical solutions in the implementation manners of the present invention with reference to the accompanying drawings in the implementation manners of the present invention.

Figure 1:
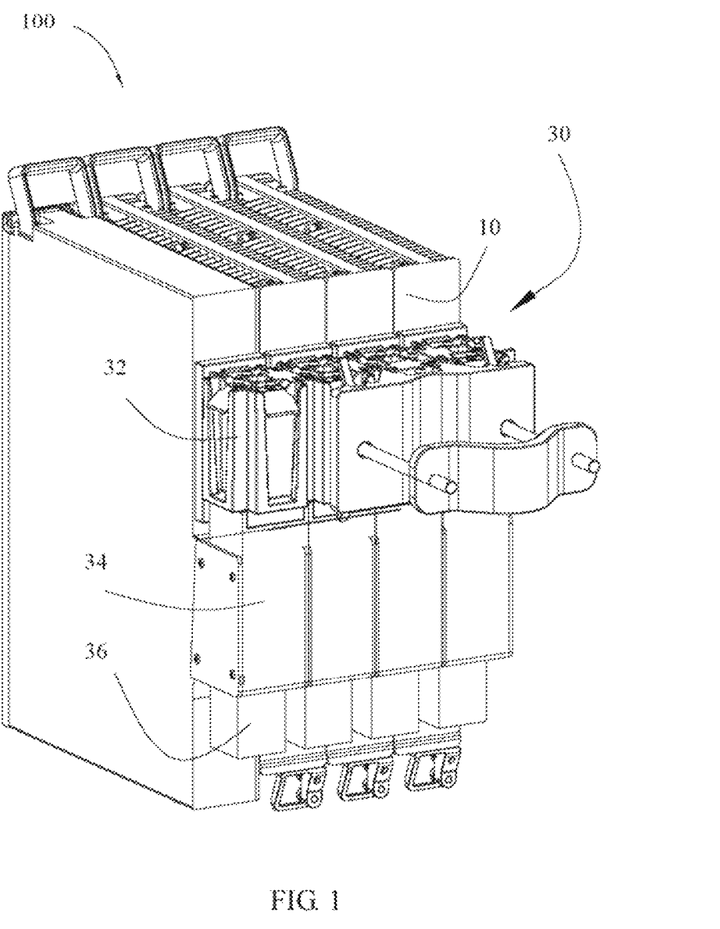
FIG. 1 is a three-dimensional schematic diagram of a communications product according to an implementation manner of the present invention.
Figure 2:
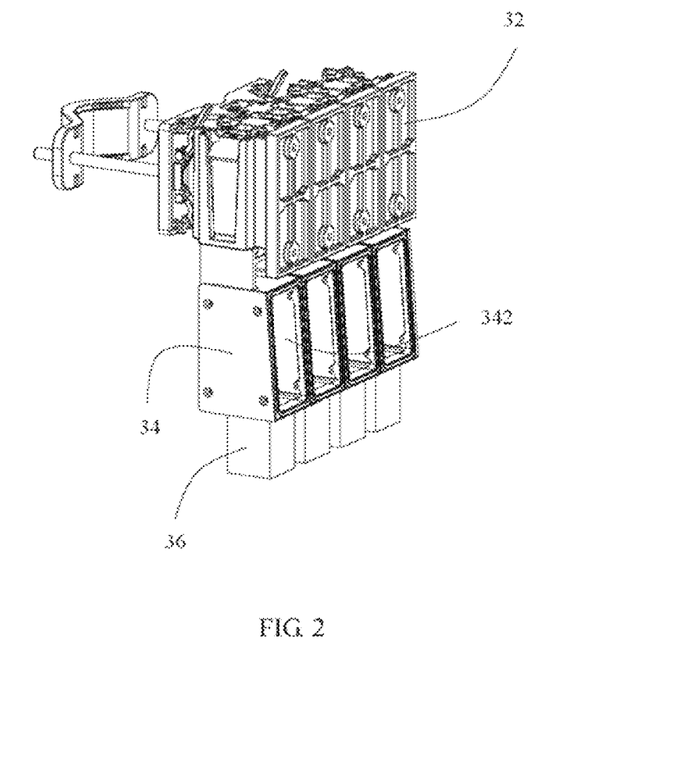
FIG. 2 is a three-dimensional schematic diagram of a mounting kit of a communications product according to an implementation manner of the present invention.
Figure 3:
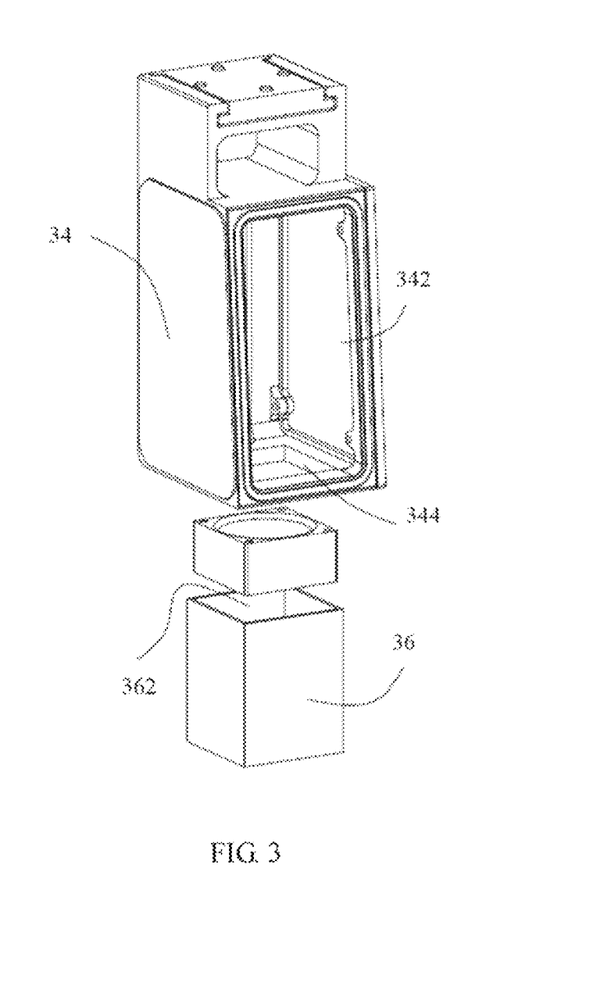
FIG. 3 is a three-dimensional schematic exploded diagram of a ventilation part and an air supply part of a mounting kit of a communications product according to an implementation manner of the present invention.

Referring to FIG. 1, FIG. 2, and FIG. 3, the present invention relates to a communications product 100, which is applied to an outdoor base station system. Generally, the communications product 100 includes a remote radio module (Radio Remote Unit, RRU) 10 and a mounting kit 30. The mounting kit 30 includes a fastening part 32, where the fastening part 32 is configured to mount and fasten the remote radio module 10 and the air supply module 20 to a holder (not shown in the figure). The holder may be a mounting iron pole or a wall surface. The communications product 100 provided in the present invention is fastened to the holder by using the fastening part 32 of the mourning kit 30, where the fastening part 32 may include a coupling configured to be fastened to the mounting iron pole or a fastening bolt configured to fasten a moving wall surface.

The mounting kit further includes a ventilation part 34 and an air supply part 36, where an air source (not shown in the figure) is disposed inside the air supply part 36, the ventilation part 34 is connected between the fastening part 32 and the air supply part 36, and a ventilation channel is disposed inside the ventilation part 34, and the ventilation channel allows the air supply part 36 to communicate with the remote radio module 10, so that an air flow generated by the air source reaches the remote radio module 10 after passing through the ventilation channel, that is, the air flow flows from the air supply part 36 into the ventilation part 34 and then flows into the remote radio module 10, to dissipate heat for the remote radio module 10.

The air source (not shown in the figure) inside the air supply part 36 is an air blasting device, such as a fan or a compressor, so that heat dissipation is implemented by means of air supply in a form of air suction or air blowing in an entire air duct.

In the present invention, the air supply part 36 provided with the air source (not shown in the figure) is disposed in the mounting kit 30; in addition, the ventilation part 34 is disposed inside the mourning kit 30, and the ventilation channel inside the ventilation part 34 allows the air source (not shown in the figure) to communicate with the remote radio module 10. External space of the fastening part 32 of the mourning kit 30 is used in the communications product 100 in the present invention to dispose the ventilation pan 34 and the air supply part 36, which avoids disposing of a fan box on the remote radio module 10. The ventilation part 34 and the air supply part 36 are integrated with the fastening part 32 into the mounting kit 30, to mount the remote radio module 10 on a holder. Therefore, the ventilation part 34 and the air supply part 36 do not occupy space of the remote radio module 10, which helps to make the remote radio module 10 thin and small. One mounting kit 30 may be configured on each remote radio module 10, that is, one air supply part 36 is configured on each remote radio module 10. In this way, the air supply part 36 that is independent of the remote radio module 10 can supply a stronger air flow and provide a better heat dissipation capability. In the present invention, a heat dissipation capability of the communications product 100 can he ensured, and it is helpful for module assembly and expansion.

In this implementation manner, the air supply part 36 and the fastening part 32 are located on two opposite sides of the ventilation part 34 respectively, the three parts are arranged in a straight line, and the ventilation part 34 is located right below or above the fastening part 32. The remote radio module 10 is fastened and connected to a side surface of the fastening part 32 by using a fastener, for example, a screw. The ventilation part 34 and the air supply part 36 may be disposed above or below the fastening part 32. When the communications product 100 includes multiple remote radio modules 10, the multiple remote radio modules 10 are arranged and disposed in one row in parallel. In addition, the communications product 100 needs multiple mounting kits 30, where the multiple mounting kits 30 are also arranged and disposed in one row in parallel, and the multiple mounting kits 30 are connected to the multiple remote radio modules 10 to form a two-row structure, which makes the entire communications product 100 compact and is helpful for reducing its size.

Figure 4:
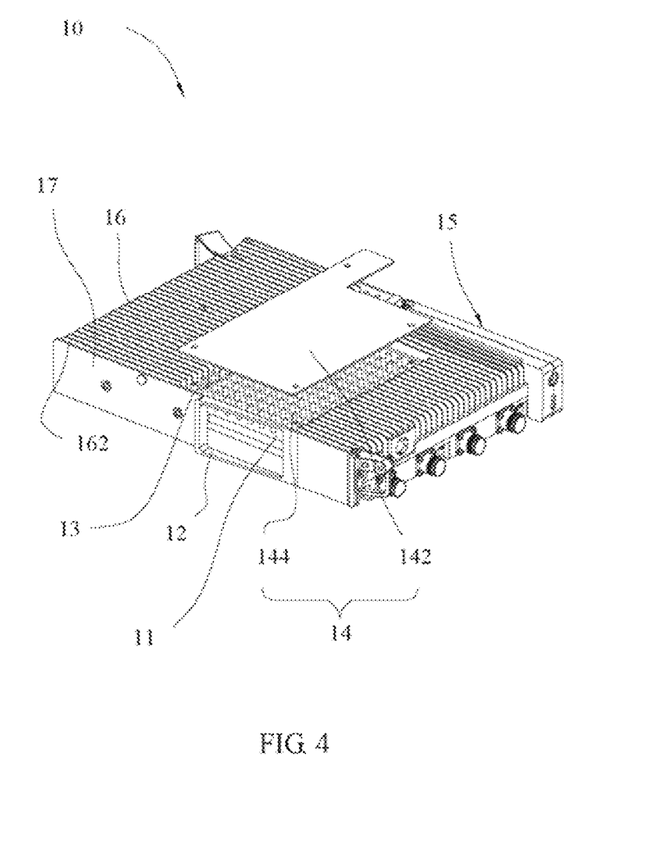
FIG. 4 is a three-dimensional schematic diagram of a remote radio module of a communications product according to an implementation manner of the present invention.

Specifically, referring to FIG. 4, the remote radio module 10 includes a front end plate 15, a rear end plate 17, a remote radio body 11, and multiple beat dissipation fins 16, where the remote radio body 11 is connected between the front end plate 15 and the rear end plate 17, the multiple beat dissipation fins 16 are located between the front end plate 15 and the rear end plate 17 and disposed on the remote radio body 11 in a protruding manner, and the fan box 20 is located on one side directly facing the heat dissipation fin 16. The multiple heat dissipation fins 16 are disposed between the front end plate 15 and the rear end plate 17 and on the remote radio body 11 in a protruding manner, so that when the air flow reaches the remote radio module 10, the air flow is dispersed among the multiple heat dissipation fins 16. The multiple heat dissipation fins 16 increase exterior heat dissipation area of the remote radio body 11, which is helpful for dissipating more heat.

Referring to FIG. 4, a first air vent 12 is disposed on the rear end plate 17 of the remote radio module 10. Referring to FIG. 3, a second air vent 362 is disposed on the air supply part 36. A first opening window 342 and a second opening window 344 are disposed on two adjacent side surfaces of the ventilation part 34 respectively, where the first opening window 342 is butt-jointed to the first air vent 12, and the second opening window 344 is butt-jointed to the second air vent 362 (as shown in FIG. 1 and FIG. 2). Because the first opening window 342 and the second opening window 344 are disposed on the two adjacent side surfaces of the ventilation part 34, that is, the remote radio module 10 and the air supply part 36 are connected to the two adjacent side surfaces of the ventilation part 34 respectively, and the ventilation part 36 is connected to the rear end plate 17 of the remote radio module 10, both the ventilation part 34 and the air supply part 36 are disposed dose to the rear end plate 17 of the remote radio module 10, which helps to compact a structure of the communications product 100.

Referring to FIG. 4, specifically, in the remote radio module 10, the multiple heat dissipation fins 16 are distributed on two sides of the remote radio body 11, and the butt-joint of the first air vent 12 to the first opening window 342 allows a ventilation channel of the ventilation part 34 to communicate with the heat dissipation fins 16 on the two sides of the remote radio body 11. The remote radio body 11 is surrounded by the front end plate 15, the rear end plate 17, and the multiple heat dissipation fins 16, which increases heat dissipation area. Metal plates with a good heat dissipation capability may be selected as the front end plate 15 and the rear end plate 17, so that the front end plate 15 and the rear end plate 17 can assist in heat dissipation.

In an implementation manner, there are multiple remote radio modules 10, the multiple remote radio modules 10 overlap each other to form two rows of communications components, the mounting kit 30 is located between the two rows of communications components, and the rear end plate 17 of the remote radio module 10 in one row of communications components faces the rear end plate 17 of the remote radio module 10 in the other row of communications components. Such an arrangement architecture is more helpful for compacting an entire structure of the communications product 100. Further, in this implementation manner, there are multiple mourning kits 30, and the mounting kits 30 are arranged in a single-row structure. The mounting kits 30 arranged in a single-row structure are clamped between the two rows of communications components, which can provide fastening and mounting and an air source for the two rows of communications components simultaneously. In this implementation manner, a first air vent 12 is disposed on the rear end plate 17 of each remote radio module 10, a second air vent 362 is disposed on each air supply part 36, one pair of first opening windows 342 and one second opening window 344 are disposed on each ventilation part 34, the pair of first opening windows 344 is distributed on two sides of the ventilation channel, the pair of first opening windows 344 is respectively butt-jointed to the first air vents 12 of the remote radio modules 10 that are located on two sides of the mounting kit 30, the second opening window 344 is distributed at the bottom or the top of the ventilation channel, and the second opening window 344 is butt-jointed to the second air vent 12.

In another implementation manner, the ventilation part 34 may be in a three-way structure or a four-way structure, that is, the ventilation part 34 further includes one or two openings in addition to the first opening window 342 communicating with the remote radio module 10 and the second opening window 344 communicating with the air supply part 36. When the communications product 100 includes two or more remote radio modules 10 that overlap each other to form one row, a quantity of the mounting kits 30 of the communications product 100 needs to be consistent with a quantity of the remote radio modules 10 accordingly, and the mounting kits 30 overlap each other to form one row. In this way, the mounting kits 30 are connected to the remote radio modules 10 to form a two-row structure. That is, the mounting kit 30 includes two or more ventilation parts 34. An objective of designing the ventilation parts 34 to be in a three-way structure or a four-way structure is to allow the two or more ventilation parts 34 to communicate with each other internally and form continuous air ducts between the two or more ventilation parts 34, implementing that two or more mounting kits 30 provide mutual supplementation and backup for air supply of the two or more remote radio modules 10. If an air source inside an air supply part 36 of one of the mounting kits 30 cannot work normally, another air supply part 36 can provide, by means of communication between the ventilation parts 34, heat dissipation for a remote radio module 10 corresponding to the air source that cannot work normally.

In order to increase air volumes inside the ventilation parts 34, when power consumption of the remote radio modules 10 is excessively high and a heat dissipation capability generated by using the air volumes supplied by an air supply part 36 of one mounting kit 30 is insufficient, one more row or more rows of ventilation parts 34 and the air supply parts 36 may be hung on the mounting kit 30, to implement auxiliary ventilation by using added air sources and increase the air volumes.

A connection manner between the air supply part 36 and the ventilation part 34 as well as a connection manner between the ventilation part 34 and the fastening part 32 may be fastening by means of screw locking, another clip-type fastening manner, or an assembled connection and fastening. Certainly, the air supply part 36 and the ventilation part 34 may be designed to be an integrated structure.

Figure 5:
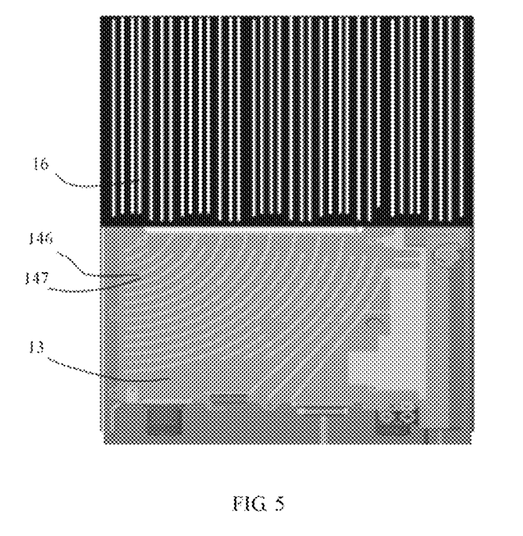
FIG. 5 is a schematic diagram of an air deflection structure in another implementation manner of a remote radio module of a communications product according the present invention.

Referring to FIG. 4 and FIG. 5, the remote radio module 10 further includes an air deflection structure 14, where the air deflection structure 14 communicates with the ventilation channel of the ventilation part 34, the air deflection structure 14 is surrounded by the heat dissipation fins 16, and the air flow from the ventilation channel 346 passes through the air deflection structure 14 and then is transmitted to the heat dissipation fins 16. In this implementation manner, the heat dissipation fins 16 include multiple sheet-like units 162 that are perpendicular to a surface of the remote radio body 11 and are spaced in parallel, where the sheet-like units 162 may be in a flat-plate structure, or may also include a curved surface structure, for example, a single sheet-like unit 162 is in an S-shape, a C-shape, or the like. Spacings between the multiple sheet-like units 162 are used for ventilation, to provide heat dissipation for the remote radio module 10.

Figure 6:
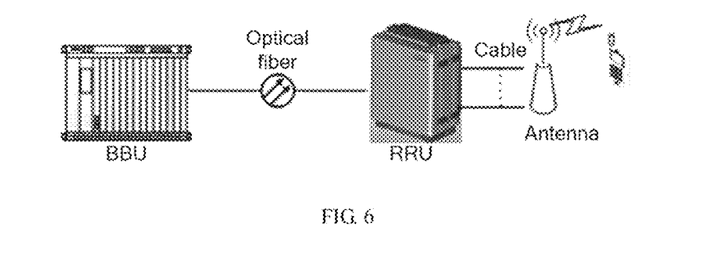
FIG. 6 is a schematic diagram of a base station system according to the present invention.

As shown in FIG. 4, the air deflection structure 14 is surrounded by the heat dissipation fins 16, the multiple heat dissipation fins 16 and the remote radio body 11 surround together to form an air deflection cavity 13, and the air deflection structure 14 can smoothly and uniformly deflect an air flow entering the air deflection cavity 13 to the heat dissipation fills 16 in a low-resistance manner. In an implementation manner, as shown in FIG. 6, the air deflection structure 14 includes an air deflection cover plate 142 and multiple air deflection pillars 144, where the multiple air deflection pillars 144 are disposed on the remote radio body 11 in a protruding manner and distributed inside the air deflection cavity 13, the air deflection cover plate 142 is fastened to the remote radio body 11 and blocks the air deflection cavity 13, and the air flow enters the air deflection cavity 13 and is distributed into the heat dissipation fins 16 after passing through the air deflection pillars 144. Specifically, the spacings between the multiple sheet-like units 162 communicate with the air deflection cavity 13, and the air flow encounters the air deflection pillars 144 after entering the air deflection cavity 13 and changes its direction when being in contact with the air deflection pillars 144, so that the air flow speeds up entering the spacings between the multiple sheet-like units 162, thereby improving heat dissipation efficiency. The air deflection pillars 144 also have a function of flow equalization. The multiple air deflection pillars 144 are distributed inside the air deflection cavity 13 in N rows and M columns (where both N and M are natural numbers, and specific values thereof depend on a size of an accommodating cavity 13 and a diameter size of the air deflection pillars 144). Reference may be made to a vertical distance between two adjacent sheet-like units 162 to determine a distance between two adjacent rows or two adjacent columns of the air deflection pillars 144. The distance between two adjacent rows or two adjacent columns of the air deflection pillars 144 may be equal to the vertical distance between two adjacent sheet-like units 162.

In a further design of the present invention, each air deflection pillar 144 is cylindrical and vertically disposed between the remote radio body 11 and the air deflection cover plate 142. The air deflection pillar 144 may also be designed to be in a columnar structure with a cross-section of a triangle or a polygon.

An end surface, far away the remote radio body 11, of each air deflection pillar 144 fits the air deflection cover plate 142. Both the air deflection pillar 144 and the air deflection cover plate 142 include a thermal conductive material, for example, a metal material. Cooling tubes or cooling fluid may also be disposed inside the air deflection pillars 144 and the air deflection cover plate 142, to improve a heat dissipation effect of the remote radio module 10.

In another implementation manner, as shown in FIG. 5, FIG. 5 shows a schematic diagram of an air deflection structure 14 in another implementation manner. The heat dissipation fins 16 and the remote radio body 11 together form an accommodating cavity 13, multiple air deflection plates 146 are disposed inside the accommodating cavity 13 to replace the multiple air deflection pillars 144, multiple air deflection channels 147 are formed inside the accommodating cavity 13 by using the multiple air deflection plates 146, and an air flow entering the accommodating cavity 13 is directly deflected to the heat dissipation fins 16 after passing through the multiple air deflection channels 147. In this implementation manner, the multiple air deflection plates 146 are all in a circular arc sheet-like structure. The air flow hits a circular arc surface of the air deflection plates 146, and the circular arc surface allows the air flow to change its direction, so that the air flow flows to the spacings between the multiple sheet-like units 162 of the heat dissipation fins

16. The air deflection plates 146 can smoothly and uniformly deflect the air flow entering the accommodating cavity 13 to the heat dissipation fins 16 in a low-resistance manner. Further, an end surface, far away from the remote radio body 11, of each air deflection plate 146 fits the air deflection cover plate 142, and the multiple air deflection plates 146 include a thermal conductive material, or a cooling material is filled inside the air deflection plates 146, which allows the multiple air deflection plates 146 to have effects of air deflection and heat dissipation.

Specifically, the air deflection structure is adjacent to the first air vent 12 of the rear end plate 17.

Referring to FIG. 6, the present invention further provides a base station system, including an equipment room and an antenna, where a baseband processing unit (Building Base band Unite, BBU) is disposed inside the equipment room, the base station system further includes the communications product 100, where the remote radio module 10 of the communications product 100 is connected to the baseband processing unit by using an optical fiber, the holder is close to the antenna, the remote radio module is close to the antenna and is mounted on the holder, and the remote radio module 10 is electrically connected to the antenna by using a coaxial cable and a power splitter.

The foregoing descriptions are exemplary implementation manners of the present invention. It should be noted that a person of ordinary skill in the art may make several improvements and polishing without departing from the principle of the present invention and the improvements and polishing shall fall within the protection scope of the present invention.

What is claimed is:

1. A communications product, comprising a remote radio module and a mounting kit, wherein the mounting kit comprises a fastening part, the fastening part is configured to mount and fasten the remote radio module to a holder, the mounting kit further comprises a ventilation part and an air supply part, an air source is disposed inside the air supply part, the ventilation part is connected between the fastening part and the air supply part, a ventilation channel is disposed inside the ventilation part, and the ventilation channel allows the air supply part to communicate with the remote radio module, so that an air flow generated by the air source reaches the remote radio module after passing through the ventilation channel, to dissipate heat for the remote radio module.

2. The communications product according to claim 1, wherein the air supply part and the fastening part are located on two opposite skies of the ventilation part respectively, the three parts are arranged in a straight line, and the ventilation part is located right below or above the fastening part.

3. The communications product according to claim 1, wherein the remote radio module comprises a front end plate, a rear end plate, a remote radio body, and multiple heat dissipation fins, wherein the remote radio body is connected between the front end plate and the rear end plate, the multiple heat dissipation fins are located between the front end plate and the rear end plate and disposed on the remote radio body in a protruding manner, and the mounting kit is connected to the rear end plate.

4. The communications product according to claim 3, wherein a first air vent is disposed on the rear end plate, a second air vent is disposed an the air supply part, a first opening window and a second opening window are disposed on two adjacent side surfaces of the ventilation part respectively, the first opening window is butt-jointed to the first air vent, and the second opening window is butt-jointed to the second air vent.

5. The communications product according to claim 4, wherein the multiple heat dissipation fins are distributed on two sides of the remote radio body, and the butt-joint of the first air vent to the first opening window allows the ventilation channel to communicate with the heat dissipation fins on the two sides of the remote radio body.

6. The communications product according to claim 3, wherein there are multiple remote radio modules, the multiple remote radio modules overlap each other to form two rows of communications components, the mounting kit is located between the two rows of communications components, and the rear end plate of the remote radio module in one row of communications components faces the rear end plate of the remote radio module in the other row of communications components.

7. The communications product according to claim 6, wherein there are multiple mounting kits, and the mounting kits are arranged in a single-row structure.

8. The communications product according to claim 7, wherein a first air vent is disposed on the rear end plate of each remote radio module, a second air vent is disposed on each air supply part, one pair of first opening windows and one second opening window are disposed on each ventilation part, the pair of first opening windows is distributed on two sides of the ventilation channel, the pair of first opening windows is respectively butt-jointed to the first air vents of the remote radio modules, which are located on two sides of the mounting kit, the second opening window is distributed at the bottom or the top of the ventilation channel, and the second opening window is butt-jointed to the second air vent.

9. The communications product according to claim 3, wherein the remote radio module further comprises an air deflection structure, the air deflection structure communicates with the ventilation part internally, the air deflection structure is surrounded by the heat dissipation Ins, and the air flow flows from the ventilation part into the air deflection structure and then is transmitted to the heat dissipation fins.

10. The communications product according to claim 9, wherein the air deflection structure comprises an air deflection cover plate and multiple air deflection pillars, the multiple heat dissipation fins and the remote radio body surround together to form an air deflection cavity, the multiple air deflection pillars extend from side surfaces of the remote radio body and are distributed inside the air deflection cavity, the air deflection cover plate covers top ends of the multiple air deflection pillars and blocks the air deflection cavity, and the air flow enters the air deflection cavity and is distributed into the multiple heat dissipation fins after passing through the air deflection pillars.

11. The communications product according to claim 9, wherein the heat dissipation fins and the remote radio body together form an accommodating cavity, the air deflection structure comprises an air deflection cover plate and multiple air deflection plates, multiple air deflection channels are formed inside the accommodating cavity by using the multiple air deflection plates, the air deflection cover plate is fastened to the remote radio body and blocks the accommodating cavity, and the air flow enters the accommodating cavity and is distributed into the heat dissipation fins after passing through the air deflection channels disposed between the multiple air deflection plates.

12. The communications product according to claim 9, wherein the air deflection structure is adjacent to the rear end plate.

13. A base station system, comprising an equipment room and an antenna, wherein a baseband processing unit is disposed inside the equipment room, the base station system further comprises a communications product, a remote radio module of the communications product is connected to the baseband processing unit by using an optical fiber, a holder is close to the antenna, and the remote radio module is electrically connected to the antenna;

the communications product comprises a remote radio module and a mounting kit, wherein the mounting kit comprises a fastening part, the fastening part is configured to mount and fasten the remote radio module to a holder, the mounting kit further comprises a ventilation part and an air supply part, an air source is disposed inside the air supply part, the ventilation part is connected between the fastening part and the air supply part, a ventilation channel is disposed inside the ventilation part, and the ventilation channel allows the air supply part to communicate with the remote radio module, so that an air flow generated by the air source reaches the remote radio module after passing through the ventilation channel, to dissipate heat for the remote radio module.

14. The communications product according to claim 13, wherein the air supply part and the fastening part are located on two opposite sides of the ventilation part respectively, the three parts are arranged in a straight line, and the ventilation part is located right below or above the fastening part.

15. The communications product according to claim 13, wherein the remote radio module comprises a front end plate, arrear end plate, a remote radio body, and multiple heat dissipation fins, wherein the remote radio body is connected between the front end plate and the rear end plate, the multiple heat dissipation fins are located between the front end plate and the rear end plate and disposed on the remote radio body in a protruding manner, and the mourning kit is connected to the rear end plate.

16. The communications product according to claim 15, wherein a first air vent is disposed on the rear end plate, a second air vent is disposed on the air supply part, a first opening window and a second opening window are disposed on two adjacent side surfaces of the ventilation part respectively, the first opening window is butt-jointed to the that air vent, and the second opening window is butt-joined to the second air vent.

17. The communications product according to claim 16, wherein the multiple heat dissipation fins are distributed on two sides of the remote radio body, and the butt-joint of the first air vent to the first opening window allows the ventilation channel to communicate with the heat dissipation fins on the two sides of the remote radio body.

18. The communications product according to claim 15, wherein there are multiple remote radio modules, the multiple remote radio modules overlap each other to form two rows of communications components, the mounting kit is located between the two rows of communications components, and the rear end plate of the remote radio module in one row of communications components faces the rear end plate of the remote radio module in the other row of communications components.

19. The communications product according to claim 18, wherein there are multiple mounting kits, and the mounting kits are arranged in a single-row structure.

20. The communications product according to claim 19, wherein a first air vent is disposed on the rear end plate of each remote radio module, a second air vent is disposed on each air supply part, one pair of first opening windows and one second opening window are disposed on each ventilation part, the pair of first opening windows is distributed on two sides of the ventilation channel, the pair of first opening windows is respectively butt-jointed to the first air vents of the remote radio modules, which are located on two sides of the mounting kit, the second opening window is distributed at the bottom or the top of the ventilation channel, and the second opening window is butt-jointed to the second air vent.

21. The communications product according to claim 15, wherein the remote radio module further comprises an air deflection structure, the air deflection structure communicates with the ventilation part internally, the air deflection structure is surrounded by the heat dissipation fins, and the air flow flows from the ventilation part into the air deflection structure and then is transmitted to the heat dissipation fins.

22. The communications product according to claim 21, wherein the air deflection structure comprises an air deflection cover plate and multiple air deflection pillars, the multiple heat dissipation fins and the remote radio body surround together to form an air deflection cavity, the multiple air deflection pillars extend from side surfaces of the remote radio body and are distributed inside the air deflection cavity, the air deflection cover plate covers top ends of the multiple air deflection pillars and blocks the air deflection cavity; and the air flow enters the air deflection cavity and is distributed into the multiple heat dissipation fins after passing through the air deflection pillars.

23. The communications product according to claim 21, wherein the heat dissipation fins and the remote radio body together form an accommodating cavity, the air deflection structure comprises an air deflection cover plate and multiple air deflection plates, multiple air deflection channels are formed inside the accommodating cavity by using the multiple air deflection plates, the air deflection cover plate is fastened to the remote radio body and blocks the accommodating cavity, and the air flow enters the accommodating cavity and is distributed, into the heat dissipation fins after passing through the air deflection channels disposed between the multiple air deflection plates.

* * * * *

UNITED STATES PATENT AND TRADEMARK OFFICE
CERTIFICATE OF CORRECTION

| | | |
|---|---|---|
| PATENT NO. | : 9,872,416 B2 | Page 1 of 1 |
| APPLICATION NO. | : 15/435711 | |
| DATED | : January 16, 2018 | |
| INVENTOR(S) | : Youhe Ke et al. | |

It is certified that error appears in the above-identified patent and that said Letters Patent is hereby corrected as shown below:

In the Claims

Column 9, Line 51:
In Claim 2, delete "skies" and insert -- sides --, therefore.

Column 9, Line 65:
In Claim 4, delete "an" and insert -- on --, therefore.

Column 10, Line 39:
In Claim 9, delete "Ins," and insert -- fins, --, therefore.

Column 11, Line 34:
In Claim 15, delete "arrear" and insert -- a rear --, therefore.

Column 11, Line 39:
In Claim 15, delete "mourning" and insert -- mounting --, therefore.

Column 11, Line 46:
In Claim 16, delete "that" and insert -- first --, therefore.

Column 11, Line 47:
In Claim 16, delete "butt-joined" and insert -- butt-jointed --, therefore.

Signed and Sealed this
Tenth Day of April, 2018

Andrei Iancu
*Director of the United States Patent and Trademark Office*